United States Patent [19]

Grimmer et al.

[11] Patent Number: 4,873,201
[45] Date of Patent: Oct. 10, 1989

[54] METHOD FOR FABRICATING AN INTERCONNECTED ARRAY OF SEMICONDUCTOR DEVICES

[75] Inventors: Derrick P. Grimmer, White Bear Lake; Kenneth R. Paulson, North St. Paul; James R. Gilbert, St. Paul, all of Minn.

[73] Assignee: Minnesota Mining and Manufacturing Company, St. Paul, Minn.

[21] Appl. No.: 131,416

[22] Filed: Dec. 10, 1987

[51] Int. Cl.[4] .............................................. H01L 31/18
[52] U.S. Cl. .................................... 437/51; 437/2; 437/195; 136/244
[58] Field of Search ................. 437/2, 173, 3, 4, 5, 437/51, 190, 195; 136/244

[56] References Cited

U.S. PATENT DOCUMENTS

| 4,603,470 | 8/1986 | Yamazaki | 437/61 |
| 4,724,011 | 2/1988 | Turner et al. | 437/2 |
| 4,745,078 | 5/1988 | Stetter et al. | 437/228 |
| 4,746,618 | 5/1988 | Nath et al. | 437/2 |
| 4,758,526 | 7/1988 | Thalheimer | 437/4 |

FOREIGN PATENT DOCUMENTS 0119979  6/1987  Japan ..................................... 437/4

Primary Examiner—Brian E. Hearn
Assistant Examiner—Tuan Nguyen
Attorney, Agent, or Firm—Kinney & Lange

[57] ABSTRACT

Semiconductor layer and conductive layer formed on a flexible substrate, divided into individual devices and interconnected with one another in series by interconnection layers and penetrating terminals.

48 Claims, 3 Drawing Sheets

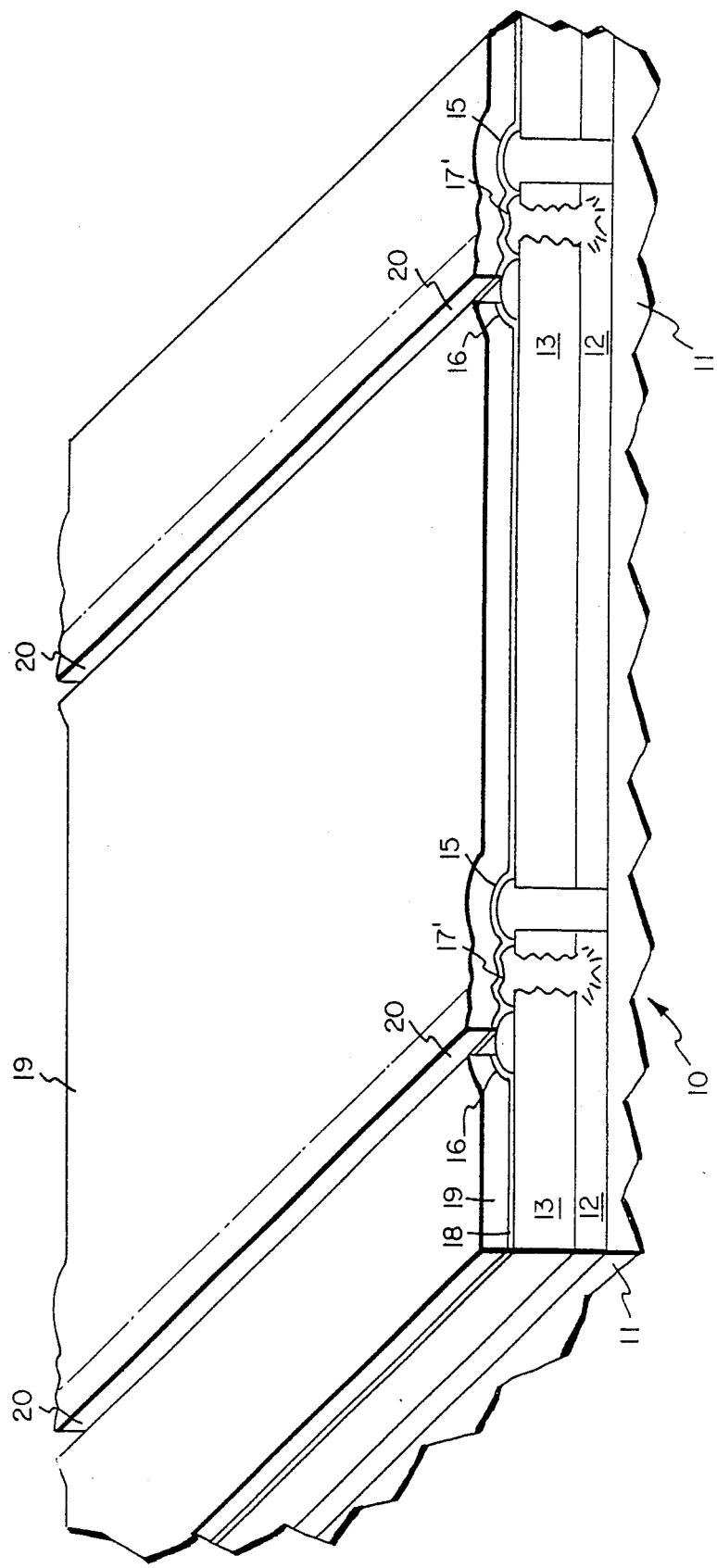

METHOD FOR FABRICATING AN INTERCONNECTED ARRAY OF SEMICONDUCTOR DEVICES

The Government of the United States of America has rights in this invention pursuant to Subcontract ZB-4-03056-2 awarded by the United States Department of Energy.

BACKGROUND OF THE INVENTION

1. Field of the Invention

The present invention relates to interconnecting in series a sequence of semiconductor devices and, more particularly, to interconnecting in series an array of photovoltaic devices.

Solar cells represent a source of electrical energy based on an inexhaustable "fuel", with the operation of such devices being nonpolluting. The primary difficulty in the use of a photovoltaic device based electrical energy source has been economics. The costs of fabricating solar cells have heretofore prevented widespread use of such cells for providing electrical energy, and have confined such use to special situations where the fabrication economics do not make the use thereof prohibitive.

A major improvement in economics follows from the use of amorphous silicon as the semiconductor material in the solar cells rather than crystalline silicon. Crystalline silicon is an indirect-band-gap material meaning that a lattice phonon is required to participate in the absorption process with an incident photon. Thus, crystalline silicon absorbs electromagnetic radiation relatively weakly. Amorphous silicon, on the other hand, is a direct-band-gap material of an effectively larger band-gap in which the incident photon can be absorbed without an interaction being required of lattice phonons. As a result, an amorphous silicon layer of a given thickness can absorb as much electromagnetic radiation from the sun as can a crystalline silicon layer many times its thickness, typically in a thickness ratio of fifty to one, even though at a somewhat shorter wavelength range. Thus, very much thinner films of amorphous silicon can be used and still absorb the same amount of incident radiation energy, a structure which reduces the cost of a solar cell considerably.

The use of amorphous silicon, however, has problems of its own. The pure material has a low resistivity and is insensitive to the addition of doping impurities because there are relatively large numbers of electronic energy states occurring at energy values that would be in approximately an energy state gap in crystalline silicon. Thus, this region of amorphous silicon is often referred to as a "pseudogap" and is located in the mobility gap between extended energy states. These additional electronic states arise because of the presence of small voids throughout the amorphous silicon which give rise to various dangling bonds and distorted bonds between silicon atoms.

This situation, which would otherwise make amorphous silicon a poor candidate for forming solar cells, is greatly improved by introducing a substantial concentration of hydrogen into the amorphous silicon, usually to the extent that hydrogen represents many atomic percent of the resulting material. This hydrogenated amorphous silicon is usually designated as a-Si:H. This improvement follows from hydrogen forming bond with the silicon to eliminate dangling bonds, and also breaking distorted bonds, through the hydrogen bonding to the silicon atoms. These effects, and others, lead to material which has a relatively well defined energy gap and in which the semiconductor properties can be controlled by the doping of further impurities. That is, n-type conductivity material can be provided by doping with phosphorus, and p-type conductivity material can be provided through doping with boron, as examples. This situation permits the forming of p-n junction structures or p-i-n structures ("i" meaning intrinsic or near intrinsic semiconductor material) so that amorphous silicon structures subject to incident electromagnetic radiation can be operated as photovoltaic solar cells.

Such solar cells are usually formed in a large array of individual cells to capture large amounts of incident sunlight. However, because p-n junctions or p-i-n layer arrangements formed in doped a-Si:H yield photovoltaic cells with open circuit voltages measuring several tenths of a volt, there is a desire to electrically interconnect at least some cells in the array in series to provide a greater output voltage. Typically, such cells are formed as a "sandwich-like" structure on a substrate with such cells having, as a general matter, two conductive layers with a semiconductor material layer therebetween where one of the conductive layers is directly on the substrate. The semiconductor layer has a p-n junction or p-i-n layer arrangement therein more or less parallel to the conductive layers. One of the conductive layers is transparent to pass incident electromagnetic radiation to the semiconductor material layer (the substrate will also be transparent if it directly supports the transparent conductive layer). There is difficulty with this arrangement in electrically interconnecting the conductive layer adjacent the substrate in one cell, because of it being covered by the other "sandwich" layers, to the conductive layer of an adjacent cell on the opposite side of the semiconductor material layer therein.

An arrangement is desired for effecting such interconnections which is economical and reliable. Such interconnections must be made in a process compatible with fabricating large volumes of solar cells.

SUMMARY OF THE INVENTION

The present invention provides a plurality of semiconductor devices on a substrate each having a penetrating terminal extending from a conductive layer through a semiconductor material layer where it is in electrical contact with a conductive interconnection layer formed across intervening material in a separating space between adjacent semiconductor devices to electrically contact the semiconductor material layer of the adjacent device, with said penetrating terminal being spaced apart from such separating spaces. A device is formed, electrically interconnected to the next device, from a semiconductor material layer supported on a conductive layer on a substrate by dividing these two layers to form a plurality of semiconductor devices, forming an electrical insulating material in separating spaces provided by such dividing, and forming a penetrating terminal in each device through the semiconductor material layer to the conductive layer on the substrate. An upper conductive layer as an interconnection layer can be initially present and divided over the region of dividing of the semiconductor material and other conductive layer, with the material for the penetrating terminal being in contact with an adjacent semiconductor device interconnection layer. Alternatively, the interconnection layer can be provided afterward extending from the penetrating terminal onto the intervening material in the separating space and into electrical contact with the semiconductor material layer of the adjacent device. The penetrating terminal is formed by applying a laser beam to metal comprising material placed on the semiconductor material layer of each semiconductor device.

BRIEF DESCRIPTION OF THE DRAWINGS

FIGS. 1A through 1H show results of steps in the process of fabricating the device of the present invention, FIGS. 2A through 2D show results of an alternative for some of the steps in the process of FIGS. 1A through 1H for fabricating the device of the present invention, FIGS. 3A through 3F show results of steps in an alternative process of fabricating the device of the present invention, FIGS. 4A and 4B show results of an alternative for some of the steps in the process of FIGS. 3A through 3F for fabricating the device of the present invention, and FIGS. 5A through 5C show results of an alternative for some of the steps in the process of FIGS. 3A through 3F for fabricating the device of the present invention.

DETAILED DESCRIPTION OF THE PREFERRED EMBODIMENTS

Figure 1A:
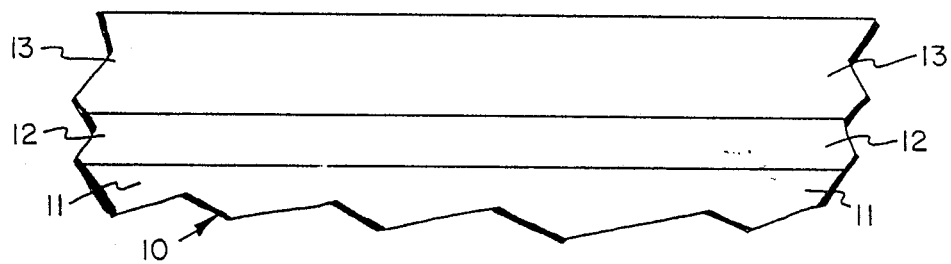

FIG. 1A shows a portion of an initially prepared layer structure, 10, from which solar cell semiconductor devices are to be formed. Layered structure 10 can be prepared by well known methods and so its fabrication process is not set forth here.

Layered structure 10 has a substrate, 11, formed of polyimide having a thickness of approximately 2.0 mils. Formed on substrate 11 is a layer, 12, of aluminum or aluminum alloy having a thickness of approximately 0.1 $\mu$m with a highly reflective top surface. Layer 12 supports a semiconductor material layer, 13, at its lower major surface of a 0.5 $\mu$m thickness formed of a-Si:H and doped, using well known methods, to provide a p-n junction or a p-i-n layer arrangement which is approximately parallel to layer 12. Layer 12 is in electrical contact with the lower major surface of semiconductor material layer 13 on one side of this p-n junction or a p-i-n layer arrangement. (A further possibility would be to eliminate a physical structure-based semiconductor junction in semiconductor layer 13 and have the transparent layer to be provided be in electrical contact with a side of layer 13 for forming a Schottky-barrier therewith.)

No representation of the p-n junction present in the figures of this application is provided, as it would unnecessarily complicate them. Further, these figures are not to actual scale, and proportions have been chosen for clarity rather than actual physical representation.

Figure 1B:
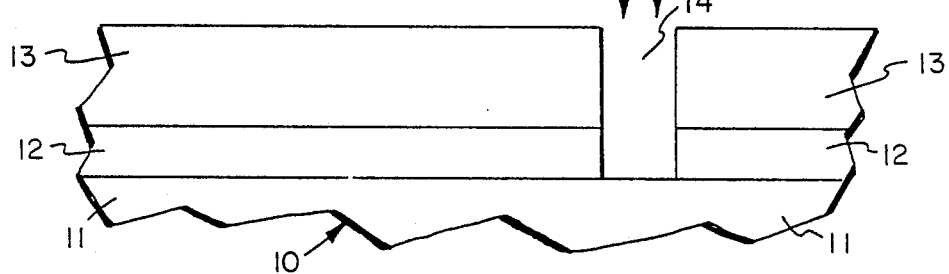

FIG. 1B shows the results of dividing conductive layer 12 and semiconductor layer 13 in layered structure 10 into a plurality of layer portions each of which will form a solar cell semiconductor device. The division is made by a YAG laser of a 532 nm wavelength scribing across layer structure 10 at a traverse speed of 180 in/min. with an output power of 250 mw to remove material where the beam impinges down to polyimide substrate 11. The laser provides a satisfactory beam for leaving a separating space, 14, between each of the layer portions of approximately 50 $\mu$m in width.

The dividing of layers 12 and 13 simultaneously has been found to be especially effective with these two layers being provided on flexible polyimide substrate 11. If metal layer 12 is divided without semiconductor layer 13 thereon, portions of the metal splatter and form a deposited debris in detrimental locations. Attempts to clean away such debris, by ultrasonic cleaning for instance, damage the remaining portions of layer 12 probably because of substrate 11 being flexible. Semiconductor layer 13 prevents such splattering during the laser dividing process.

Layered structure 10 in FIG. 1B is formed as an elongated arrangement to the right and the left of what is shown so that a plurality of openings 14 to the right and left of the one shown and perpendicular to the plane of the paper are also formed. These openings lead to a plurality of solar cell semiconductor devices being formed. The elongated arrangement can be stored in rolls before or after subsequent process steps to make convenient the handling of large numbers of joined semiconductor devices.

Thereafter, through the use of screen or ink-jet printing, a polymer "ink" is applied to fill opening 14 and to cover a portion of the upper major surface of semiconductor material layer 13 near and on either side of opening 14. This polymer ink material forms an intervening electrical insulating material, 15, in opening 14 which serves to further electrically isolate adjacent solar cell semiconductor devices from one another. A suitable polymer for this purpose which can be printed in this manner is Advance ADE-Series air-dry polymer.

Simultaneously, or alternatively, either before or after, additional polymer material is printed at another location on the upper major surface of semiconductor material layer 13 to form a surface protection layer, 16, spaced apart from intervening material 15 formed in opening 14. The same polymer material used for intervening material 15 is suitable for polymer 16. Polymers 15 and 16 are both printed as a strip perpendicular to the plane of the view shown in FIG. 1C and more or less parallel to one another. The width of these strips on the upper major surface of semiconductor material layer 13 is approximately 16 mils but may be less.

Between intervening material 15 and surface protecting material 16 there is next printed, again by screen printing methods, a silver filled polymer ink strip, 17. Thus, the extent of strip 17 on the upper major surface of semiconductor material layer 13 is limited by the presence of strips 15 and 16, as shown in FIG. 1D permitting convenient screen printing thereof in rapid, large volume fabrication operations. A suitable material for silver filled polymer ink 17 is Amicon C-225 Series inks.

Figure 1C:
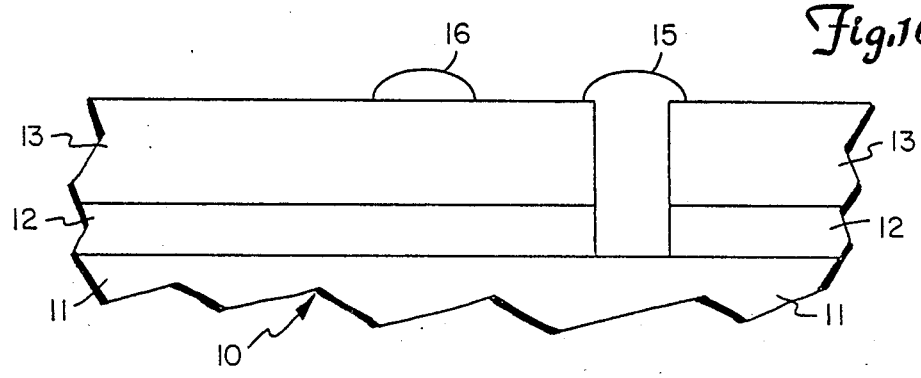
Figure 1D:
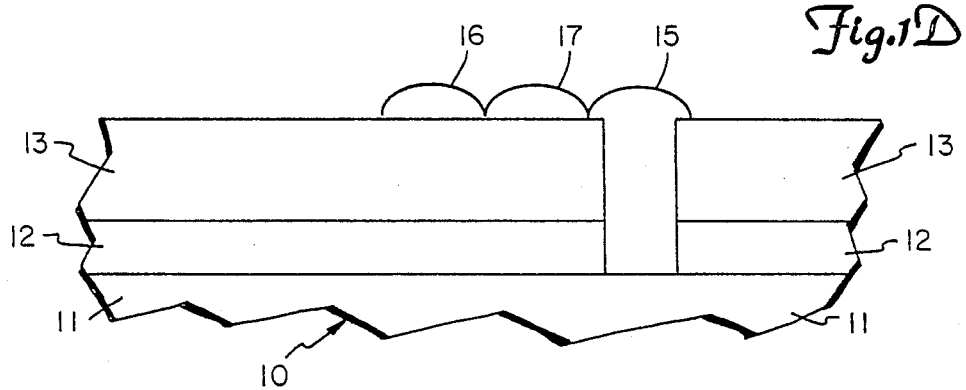
Figure 1E:
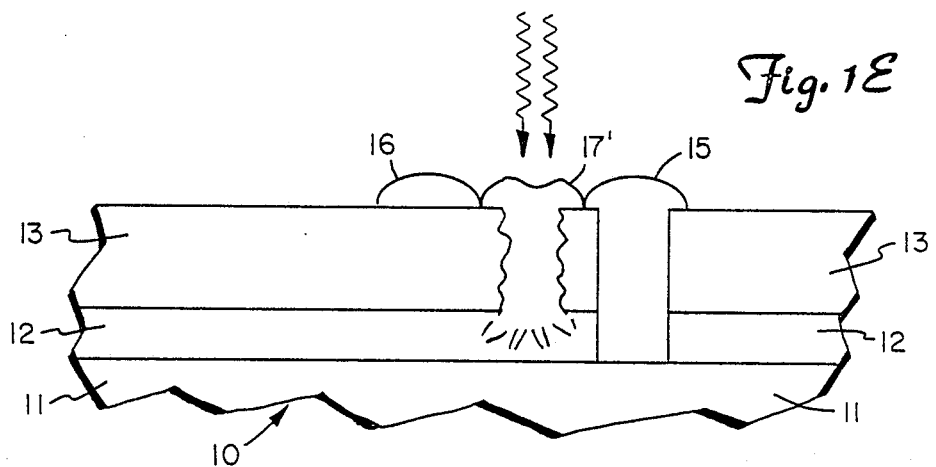

Again using a 532 nm YAG laser, a laser beam is directed along silver filled polymer ink 17 at 2.0 in/sec with an output power of 350 mw causing this material to heat substantially and be driven downward through semiconductor material layer 13 to make contact with aluminum conductor layer 12 supporting layer 13 to thereby form a conductive penetrating terminal now designated 17' in FIG. 1E. Thus, an interconnection means to conductive support layer 12 is made available at the upper major surface of semiconductor material layer 13 spaced apart from the separating space filled with intervening material 15. Because semiconductor material layer 13 is amorphous, the presence of a conductor 17' in electrical contact with this layer on either side of any p-n junction or intrinsic layer contained therein is not a shorting problem. The resistivity of the amorphous silicon material, even doped, is so great laterally that only a very small portion of the junction is in effect shorted by penetrating terminal 17'.

Thereafter, a very thin layer, 18, of approximately 200 Å thickness of tin oxide is sputter deposited on the upper device surface at the stage shown in FIG. 1E as a conductive, diffusion barrier. The deposition is from a 97% Sn/3% Sb metal alloy target and done with substrate 11 and the semiconductor devices thereon passing from roll to roll through the operation at 20 ft/min resulting in a layer with a bulk resistivity of about $7 \times 10^{-2} \Omega\text{-cm}$. A further layer, 19, of 2000 Å of indium tin oxide is then sputter deposited on the layer of tin oxide with the result shown in FIG. 1F. This deposition uses a 95% In/5% Sn metal alloy target with the tin oxide covered semiconductor devices on substrate 11 passing through the operation at 1 ft/min. The resulting film has a bulk resistivity of about $5.6 \Omega\text{-cm} \times 10^{-3}$. Together films 18 and 19 have a sheet resistance of approximately $28 \Omega/\text{square}$. Layer 18 prevents indium from reaching semiconductor material layer 13 to thereby adversely affect the electrical characteristics of this layer. Layer 19 is more conductive than is layer 18 and so is used to form the bulk of interconnection layer 18,19.

Figure 1F:
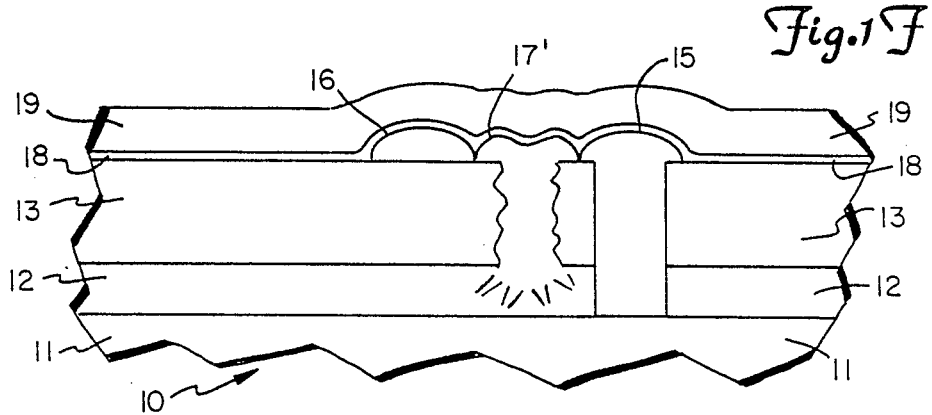

These two layers, 18 and 19, are transparent to portions of the spectrum of sunlight which are significantly absorbed by semiconductor material layer 13 so that electromagnetic radiation from the sun coming from above in FIG. 1F will reach semiconductor layer 13. The thickness of layers 18 and 19 together are chosen so that they are approximately three-quarters of a wavelength in thickness for the peak wavelength in the visible spectrum. This is an antireflection measure to assure that there is good transfer of incident electromagnetic radiation from the sun to semiconductor material layer 13 for absorption therein.

Figure 1G:
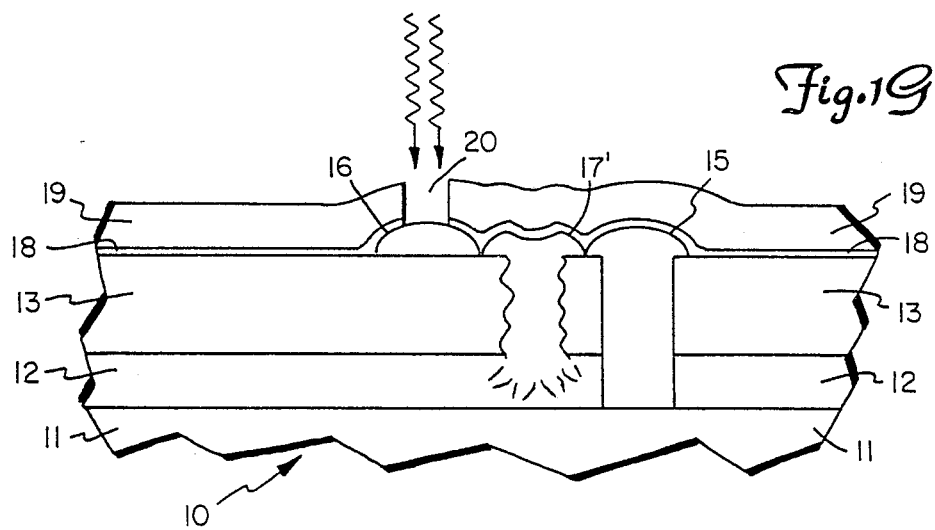

Finally, a 532 nm YAG laser is again used to divide transparent interconnection layers 18 and 19 by directing the laser beam along the layers at 300 in/min with an output power of 160 mw to form a gap, 20, therein over surface protecting strip 16. Again, gap 20 as formed is approximately 50 µm wide. Surface protecting material 16 protects semiconductor material layer 13 from being damaged by the laser beam. Surface protecting layer 16 could be eliminated if the laser beam was chosen to have enough energy to divide layers 18 and 19 without damaging semiconductor layer 13, and if silver filled polymer ink 17 can be printed sufficiently accurately on the surface of semiconductor layer 13 without the blocking effect provided by strip 16. The final result is shown in FIG. 1G where the right-hand portion of interconnection layers 18 and 19 on the right side of gap 20 is in electrical contact with penetrating terminal 17' and extends onto intervening material 15 across the separating space 14 in which material 15 has been placed and on to the upper major surface of semiconductor material layer 13 in the adjacent solar cell semiconductor device. This interconnection layer portion ends on the surface protection strip 16 formed in that device just as the portion of layers 18 and 19 to the left of gap 20 in FIG. 1A ends on strip 16.

Other alternatives in this process would be to dispense with intervening material 15 in separating space 14 and, alternatively, subject the structure of FIG. 1B to an oxidizing atmosphere to form an electrically insulative oxide on the exposed ends of aluminum layer 12. Presently, the use of polymer insulating material in opening 14 is preferred. Also, rather than using a silver filled polymer ink for strip 17 and so penetrating terminal 17', a metal strip can be sputter deposited alternatively and subjected to the laser beam at a linear series of point locations along the metal strip to drive that metal through semiconductor material layer 13 to be in electrical contact with support layer 12. A typical metal arrangement for strip 17 would be to have a first layer of chromium in a thickness of 50 Å, followed by 7500 Å of silver, and completed with another 400 Å of chromium.

Another view of the resulting device of FIG. 1G is shown in FIG. 1H. The arrangement for interconnection conductor 18,19 is more clearly shown in extending from a penetrating terminal 17' in one solar cell semiconductor device on to intervening material 15 and over to the upper major surface of the semiconductor material layer 13 in the adjacent solar cell semiconductor device.

An alternate set of completion steps for the process of FIGS. 1A through 1H is shown beginning in FIG. 2A, a set which begins after the step shown in FIG. 1C. In these steps, the providing and diffusing of the filled polymer is interchanged with the providing of the transparent interconnection layer.

Thus, transparent interconnection layer 18',19' is shown on the upper major surface of semiconductor material layer 13 over both intervening material 15 and surface protection strip 16 in FIG. 2A. Then, silver filled polymer ink strip 17" is screen printed on the upper surface of layer 19' over intervening material 15 extending on either side thereof for a distance including being sufficient to be partly over surface protection strip 16. This result is shown in FIG. 2B.

A laser beam, again from a 532 nm YAG laser, is translated in a line along polymer ink strip 17" at the location above the separation between intervening material 15 and surface protective strip 16 at 2.0 in/sec using an output power of 350 mw to heat this material sufficiently to drive it at this location through both transparent interconnection layer 18',19' and semiconductor material 13 and into electrical contact with conductive layer 12 to again form conductive penetrating terminal 17'''. This outcome is shown in FIG. 2C where the upper portion of terminal 17''' continues to be spread over a greater area of transparent interconnection layer 18',19' to thereby reduce the electrical resistance between terminal 17''' and layer 18',19'.

Thereafter, transparent interconnection layer 18',19' is again divided by use of a laser to form gap 20 over surface protection strip 16. There is thereby formed a series of transparent electrodes each (other than an end unit) over and in electrical contact with the upper major surface of a separated portion of semiconductor layer 13 and in electrical contact with penetrating terminal 17''' of an adjacent such separated portion. This is shown in FIG. 2D.

An alternative way of fabricating such a solar cell semiconductor device is shown in FIG. 3A. The initial layered structure for this alternative is now designated 10' because of an added layer being initially present beyond those shown in layered structure 10 in FIG. 1A. That is, a transparent interconnection layer 18",19" is now shown on the upper major surface of semiconductor material layer 13. Semiconductor material layer 13 again has a p-n junction or p-i-n layer arrangement (or, as before, neither if a Schottky-barrier is used) extending therethrough parallel to support layer 12 (not shown).

Once again, a division of layers 12 and 13 must be made to provide separate solar cell semiconductor devices. This division of these layers can be done simultaneously with dividing layers 18″,19″, followed by providing additional width to the opening in layers 18″,19″, or, alternatively, transparent interconnection layer 18″,19″ can be divided prior to dividing layers 12 and 13. This latter option is chosen in the example shown in FIG. 3B. There an opening, 21, is shown dividing transparent interconnection layer 18″,19″ which would be done in several places in the elongated layered structure 10′ to the right and left of that shown in FIG. 3B, the opening running perpendicular to the plane of the view in FIG. 3B. Opening 21 can be formed by using a waterjet etch moving along the material, or by a screen-printed etch paste. Such an opening might extend 50 to 100 mils in width.

Thereafter, a separating space is extended by use of a laser beam into semiconductor material layer 13 and conductive support layer 12 from opening 21 just as before to thereby form opening 14 in these layers. The results are shown in FIG. 3C.

The first option of dividing layers 12 and 13 simultaneously with transparent interconnection layers 18″,19″ is shown in FIGS. 4A and 4B which can be substituted for FIGS. 3B and 3C in the fabrication process of FIGS. 3A through 3F. The result of these layers in FIG. 3A being divided simultaneously by a laser beam is shown in FIG. 4A. As indicated above, this is followed by opening wider layers 18″,19″ about the laser-provided opening therein which is shown in FIG. 4B.

A further alternative for the fabrication process of FIGS. 3A through 3F is shown in FIGS. 5A through 5C which build on the structures shown in FIGS. 1A and 1B. These together are substituted for FIGS. 3A through 3C. The structure of FIG. 1B has an ink deposit, 22, screen-printed thereon as shown in FIG. 5A. This ink is a solvent-washable one which "outgases" very little, one such ink being supplied by the Minnesota Mining and Manufacturing Company under the designation TB 16900.

Thereafter, film 18″ and 19″ are deposited as before. This is shown in FIG. 5B. The structure at this point again is redesignated as 10″.

The portion of transparent interconnection layer 18‴,19‴ over ink deposit 22 can then be removed by using a suitable solvent to dissolve ink deposit 22 under that portion of layer 18‴,19‴. Such a solvent is methyl ethyl ketone which, applied on layer 18‴,19‴, penetrates that layer to reach deposit 22 to dissolve it. The portion of layer 18‴,19‴ thereover is also carried away to result in the structure of FIG. 5C.

The use of the laser beam to divide layers 12 and 13 has been shown prior to providing ink deposit 22 in connection with FIGS. 1A, 1B and 5A through 5C. Alternatively, the laser beam could be used after the provision of deposit 22 (deposited only on the upper major surface of semiconductor layer 13 so that the portion extending below this surface in FIGS. 5A and 5B would not be there and layers 12 and 13 would be continuous in these figures) and layers 18‴ and 19‴. The beam would be used to simultaneously divide layer 18‴,19‴, deposit 22 and layers 12 and 13. This method would prevent the debris from this process being deposited on layer 13 and provides for its being washed away by the use of the solvent to remove deposit 22 and the portions of layer 18‴,19‴ thereover. Of course, the laser beam in this situation could alternatively be used to divide layers 12 and 13 simultaneously after the solvent has removed deposit 22 and the portion of layer 18‴,19‴ thereover.

Any of these alternatives for dividing layers 12 and 13 with the transparent interconnecting layer 18″,19″ or 18‴,19‴ provided prior to such dividing is again followed by providing electrical insulating intervening material 15 in opening 14. The polymer material used previously for this purpose is again satisfactory in this step and can once more be provided using screen printing. The result can be seen in FIG. 3D. As before, a strip of this polymer material 16 is provided, typically by screen printing methods, on the upper major surface of semiconductor material layer 13. Where this strip served as a surface protection and flow blocking strip previously, it now primarily serves as a flow blocking strip.

Strip 16, again being parallel to the strip of intervening material 15, serves to block any flow of silver filled polymer ink material provided for the penetrating terminal from reaching the left-hand portion of transparent interconnection layer 18″,19″. Such a silver filled polymer ink, now designated 17⁗, is shown screen printed onto the upper major surface of semiconductor material layer 13 to the left of intervening material 15, onto intervening material 15, onto the upper major surface of semiconductor material 13 in the adjacent solar cell semiconductor device to the right of material 15, and onto the portion of transparent interconnection layer 18″,19″ of the adjacent semiconductor device to the right of material 15. The result is shown in FIG. 3E.

Silver filled polymer ink 17⁗ makes electrical contact with this right-hand portion of transparent interconnect layer 18″,19″ serving as the transparent interconnection layer for the adjacent semiconductor device. Note that there need be no concern about any of transparent interconnection layer 18″,19″ to the left of material 15 coming into contact with silver filled polymer ink 17⁗ because of the presence of strip 16 to block any such flow.

Finally, a laser beam is directed onto a portion of silver filled polymer ink 17⁗ just as before to thereby drive this material through semiconductor material layer 13 and into electrical contact with conductive support layer 12, as shown in FIG. 3F. Silver filled polymer ink 17⁗ has now been redesignated 17⁗′ as it serves both to form a penetrating terminal through semiconductor material layer 13 to support layer 12, as just stated, and to interconnect this penetrating terminal with the transparent interconnect layer 18″,19″ in the adjacent solar cell semiconductor device. Thus, once penetrating terminal-interconnection means silver filled polymer ink material 17⁗ has been deposited and the penetrating terminal portion therefrom formed by the laser beam to provide penetrating terminal-interconnection means 17⁗′, nothing further need be done to complete the solar cells (other than possible protective steps, convenience arranging steps, packaging steps, etc.) as all electrical interconnections in series between adjacent solar cell semiconductor devices have been completely formed.

Although the present invention has been described with reference to preferred embodiments, workers skilled in the art will recognize that changes may be made in form and detail without departing from the spirit and scope of the invention.

What is claimed is:

1. A method for fabricating an interconnected array of semiconductor devices based on an electrical insulating substrate initially having on a surface thereof a conductive support layer which supports a semiconductor material layer thereon having first and second major surfaces with said support layer being in electrical contact with said semiconductor material layer second major surface, said method comprising:

dividing said semiconductor material layer and said support layer into a plurality of semiconductor devices by removing selected commonly located portions of said semiconductor material layer and said support layer to thereby form separating spaces between adjacent said semiconductor devices each of which devices comprises a corresponding portion of said support layer and a corresponding portion of said semiconductor material layer having corresponding portions of said first and second major surfaces;

forming at said semiconductor material layer first major surface portions an electrical insulating intervening material in each said separating space extending through said semiconductor layer and said support layer; and forming in each said semiconductor device a penetrating terminal extending through said semiconductor material layer portion therein from said first major surface portion thereof to be in electrical contact with its corresponding said support layer portion, each said penetrating terminal being formed from a location spaced apart in said semiconductor material layer first major surface from said separating spaces with said penetrating terminal on each said semiconductor device being electrically interconnected to that said semiconductor material layer first major surface portion provided in an adjacent said semiconductor device.

2. The method of claim 1 wherein said electrical insulating substrate, said support layer, and said semiconductor material layer also have initially therewith a conductive interconnection layer on said semiconductor material layer first major surface, and wherein said dividing of said semiconductor material layer and said support layer into a plurality of semiconductor devices as aforesaid occurs only where members of a plurality of division openings in said interconnection layer are located such that there is a corresponding interconnection layer portion in each said semiconductor device.

3. The method of claim 2 wherein said interconnection layer is transparent to visible light.

4. The method of claim 3 wherein each said interconnection layer portion comprises indium tin oxide.

5. The method of claim 2 wherein said forming of a said penetrating terminal in each said semiconductor device is accomplished by depositing a material comprising a metal on said semiconductor material layer first major surface portion thereof followed by directing a laser beam onto said metal comprising material.

6. The method of claim 5 wherein said interconnection layer is divided before said semiconductor material layer and said support layer are divided.

7. The method of claim 5 wherein said interconnection layer is divided concurrently with dividing said semiconductor material layer and said support layer.

8. The method of claim 5 wherein said depositing of a metal comprising material for said forming of a penetrating terminal in each said semiconductor device is accomplished by also depositing said metal comprising material on said interconnection layer portion occurring in that adjacent said semiconductor device in which said semiconductor material first major surface portion occurs to which that said penetrating terminal formed from said deposited metal comprising material is electrically interconnected as aforesaid.

9. The method of claim 8 wherein said metal comprising material is a metal material.

10. The method of claim 2 wherein each of said interconnection layer portions, in electrically interconnecting a said semiconductor layer first major surface portion of an adjacent said semiconductor device as aforesaid, ends before coming into electrical contact with said penetrating terminal of that adjacent said semiconductor device.

11. The method of claim 10 wherein said forming of said intervening material is accompanied by forming a flow blocking material on said semiconductor material layer first major surface portion in each semiconductor device such that said penetrating terminal to be formed therein will be between said flow blocking material and said intervening material.

12. The method of claim 1 wherein said dividing of said semiconductor material layer and said support layer into a plurality of semiconductor devices as aforesaid is preceded by providing a conductive interconnection layer on said semiconductor material layer first major surface.

13. The method of claim 1 wherein said forming of said penetrating terminal in each said semiconductor device electrically interconnected to that said semiconductor material layer first major surface portion provided in an adjacent said semiconductor device as aforesaid comprises providing a plurality of conductive interconnecting layers with each one being in electrical contact with a said penetrating terminal in a said semiconductor device and extending from that said penetrating terminal onto said intervening material and across a said separating space to electrically interconnect said semiconductor material first major surface portion in an adjacent said semiconductor device.

14. The method of claim 13 wherein said forming of said intervening material is accompanied by forming a surface protective material on said semiconductor material layer first major surface portion in each said semiconductor device such that said penetrating terminal to be formed therein will be between said surface protective material and said intervening material.

15. The method of claim 1 wherein said semiconductor material layer comprises amorphous, hydrogenated silicon doped to have a p-n junction thereon.

16. The method of claim 1 wherein said semiconductor material layer comprises amorphous, hydrogenated silicon doped to have a p-type conductivity layer and an n-type conductivity layer separated by an intrinsic layer.

17. The method of claim 1 wherein said intervening material is a polymer material.

18. A method for fabricating an interconnected array of semiconductor devices based on an electrical insulating substrate initially having on a surface thereof a conductive support layer which supports a semiconductor material layer thereon having first and second major surfaces with said support layer being in electrical contact with said semiconductor material layer second major surface, said method comprising:

dividing said semiconductor material layer and said support layer into a plurality of semiconductor devices by removing selected commonly located portions of said semiconductor material layer and said support layer to thereby form separating spaces between adjacent said semiconductor devices each of which devices comprises a corresponding portion of said support layer and a corresponding portion of said semiconductor material layer having corresponding portions of said first and second major surfaces;

forming at said semiconductor material layer first major surface an electrical insulating intervening material in each said separating space extending through said semiconductor layer and said support layer;

providing a conductive interconnection layer on substantially said semiconductor material layer first major surface portions; and forming in each said semiconductor device a penetrating terminal extending through said semiconductor material layer portion therein from said first major surface portion thereof to be in electrical contact with its corresponding said support layer portion, each of said penetrating terminal being formed from a location spaced apart in said semiconductor material layer first major surface from said separating spaces with said penetrating terminal on each said semiconductor device being electrically interconnected to that said semiconductor material layer first major surface portion provided in an adjacent said semiconductor device.

19. The method of claim 18 wherein each of said conductive interconnection layers on a semiconductor material layer first major surface portion extends onto said intervening material and across a said separating space to electrically interconnect a said penetrating terminal in an adjacent said semiconductor device.

20. The method of claim 19 wherein each of said interconnection layer portions, in electrically interconnecting a said semiconductor layer first major surface portion of an adjacent said semiconductor device as aforesaid, ends before coming into electrical contact with said penetrating terminal of that adjacent said semiconductor device.

21. The method of claim 20 wherein said forming of said intervening material is accompanied by forming a flow blocking material on said semiconductor material layer first major surface portion in each semiconductor device such that said penetrating terminal to be formed therein will be between said flow blocking material and said intervening material.

22. The method of claim 19 wherein said forming of a said penetrating terminal in each said semiconductor device is accomplished by depositing a material comprising a metal on said semiconductor material layer first major surface portion thereof followed by directing a laser beam onto said metal comprising material.

23. The method of claim 22 wherein said metal comprising material is a metal filled polymer material.

24. The method of claim 22 wherein said metal comprising material is a metal material.

25. The method of claim 18 wherein a continuous said conducting interconnection layer is formed including being extended over said separation spaces in which said intervening material is formed as aforesaid.

26. The method of claim 25 wherein said forming of a said penetrating terminal in each said semiconductor device is accomplished by depositing a material comprising a metal on said conductive interconnection layer for each said semiconductor device followed by directing a laser beam onto said metal comprising material.

27. The method of claim 26 wherein said forming of said intervening material is accompanied by forming a flow blocking material on said semiconductor material layer first major surface portion in each semiconductor device such that said penetrating terminal to be formed therein will be between said flow blocking material and said intervening material.

28. The method of claim 26 wherein said metal comprising material is a metal material.

29. The method of claim 25 wherein each of said interconnection layer portions, in electrically interconnecting a said semiconductor layer first major surface portion of an adjacent said semiconductor device as aforesaid, ends before coming into electrical contact with said penetrating terminal of that adjacent said semiconductor device.

30. The method of claim 29 wherein said forming of said intervening material is accompanied by forming a flow blocking material on said semiconductor material layer first major surface portion in each semiconductor device such that said penetrating terminal to be formed therein will be between said flow blocking material and said intervening material.

31. The method of claim 18 wherein each said interconnection layer present on each said semiconductor device is transparent to visible light.

32. The method of claim 31 wherein said interconnection layer comprises indium tin oxide.

33. A method for fabricating an interconnected array of semiconductor devices based on an electrical insulating substrate initially having on a surface thereof a conductive support layer which supports a semiconductor material layer thereon having first and second major surfaces with said support layer being in electrical contact with said semiconductor material layer second major surface, said method comprising:

dividing said semiconductor material layer and said support layer into a plurality of semiconductor devices by removing selected commonly located portions of said semiconductor material layer and said support layer to thereby form separating spaces between adjacent said semiconductor devices each of which devices comprises a corresponding portion of said support layer and a corresponding portion of said semiconductor material layer having corresponding portions of said first and second major surfaces;

forming at said semiconductor material layer first major surface an electrical insulating intervening material in each said separating space extending through said semiconductor layer and said support layer; and forming at each said semiconductor device penetrating terminal by depositing a material comprising a metal on said semiconductor material layer first major surface portion thereof and thereafter directing a laser beam on to said metal comprising material, said penetrating terminal in each said semiconductor device extending through said semiconductor material layer portion therein from said first major surface portion thereof to be in electrical contact with its corresponding said support layer portion, each said penetrating terminal being formed from a location spaced apart in said semiconductor material layer first major surface from said separating spaces with said penetrating terminal on each said semiconductor device being electrically interconnected to that said semiconductor material layer first major surface portion provided in an adjacent said semiconductor device.

34. The method of claim 33 wherein said metal comprising material is a metal filled polymer material.

35. The method of claim 33 wherein said metal comprising material is a metal material.

36. A method for fabricating an interconnected array of semiconductor devices based on an electrical insulating substrate initially having on a surface thereof a conductive support layer which supports a semiconductor material layer thereon having first and second major surfaces with said support layer being in electrical contact with said semiconductor material layer second major surface, said method comprising:

providing a removable base material on said semiconductor material layer at locations where a plurality of division openings in said semiconductors interconnection layer are to be provided;

providing a conductive interconnection layer on said semiconductor material layer first major surface, said removable base material being capable of being removed by a removing material applied to said conductive interconnection layer;

forming at said semiconductor material layer first major surface an electrical insulating intervening material in each said separating space extending through said semiconductor layer and said support layer; and forming in each said semiconductor device a penetrating terminal extending through said semiconductor material layer portion therein from said first major surface portion thereof to be in electrical contact with its corresponding said support layer portion, each said penetrating terminal being formed from a location spaced apart in said semiconductor material layer first major surface from said separating spaces with said penetrating terminal on each said semiconductor device being electrically interconnected to that said semiconductor material layer first major surface portion provided in an adjacent said semiconductor device.

37. The method of claim 36 wherein said forming of a said penetrating terminal in each said semiconductor device is accomplished by depositing a material comprising a metal on said semiconductor material layer first major surface portion thereof followed by directing a laser beam onto said metal comprising material.

38. The method of claim 37 wherein said metal comprising material is a metal filled polymer material.

39. The method of claim 37 wherein said metal comprising material is a metal material.

40. The method of claim 36 wherein each of said interconnection layer portions, in electrically interconnecting a said semiconductor layer first major surface portion of an adjacent said semiconductor device as aforesaid, ends before coming into electrical contact with said penetrating terminal of that adjacent said semiconductor device.

41. The method of claim 40 wherein said forming of said intervening material is accompanied by forming a flow blocking material on said semiconductor material layer first major surface portion in each semiconductor device such that said penetrating terminal to be formed therein will be between said flow blocking material and said intervening material.

42. A method for fabricating an interconnected array of semiconductor devices based on an electrical insulating substrate initially having on the surface thereof a conductive support layer which supports a semiconductor material layer thereon having first and second major surfaces with said support layer being in electrical contact with said semiconductor material layer second major surface, and with a conductive interconnection layer supported on said semiconductor material layer first major surface which conductive interconnection layer has located therein a plurality of division openings, said method comprising:

dividing at said division opening said semiconductor material layer and said support layer into a plurality of semiconductor devices by removing selected commonly located portions of said semiconductor material layer and said support layer to thereby form separating spaces between adjacent said semiconductor device each of which comprises a corresponding portion of said support layer, a corresponding portion of said interconnection layer, and a corresponding portion of said semiconductor material layer having corresponding portions of said first and second major surfaces;

forming at said semiconductor material layer first major surface an electrical insulating intervening material in each said separating space extending through said semiconductor layer and said support layer; and forming in each said semiconductor device penetrating terminal by depositing a metal filled polymer material on said semiconductor material first major surface portion thereof and on that interconnection layer portion occurring in that said semiconductor device adjacent thereto to form an interconnection therebetween, and thereafter directing a laser beam onto said metal filled polymer material where provided on each said semiconductor material first major surface portion to cause that said penetrating terminal to extend through said semiconductor material layer portion in that said semiconductor device from said first major surface portion thereof to be in electrical contact with its corresponding support layer portion, each said penetrating terminal being formed from a location spaced apart in tis corresponding said semiconductor material layer first major surface from said separating spaces.

43. A method for fabricating an array of semiconductor devices, said method comprising:

providing a flexible, electrically insulating polymer material substrate initially having on a surface thereof a conductive support layer which supports a semiconductor material layer provided thereon having first and second major surfaces with said second major surface in electrical contact with said support layer to leave said first major surface exposed;

dividing said semiconductor material layer and said support layer simultaneously into a plurality of semiconductor devices by removing selected commonly located portions of said semiconductor material layer and said support layer through a cutting means applied to and through said semiconductor material layer first major surface exposed as aforesaid to thereby form separating spaces between adjacent said semiconductor devices each of which devices comprises a corresponding portion of said support layer and a corresponding portion of said semiconductor material layer.

44. The method of claim 43 wherein said cutting means is a laser with its beam directly impinging on said exposed first major surface.

45. The method of claim 43 wherein said polymer material substrate is a polyimide material substrate.

46. The method of claim 45 wherein said support layer comprises aluminum.

47. A method for fabricating an interconnected array of semiconductor devices based on an electrical insulating substrate initially having on a surface thereof a conductive support layer which supports a semiconductor material layer thereon having first and second major surfaces with said support layer being in electrical contact with said semiconductor material layer second major surface, said method comprising:

dividing said semiconductor material layer and said support layer into a plurality of semiconductor devices by removing selected commonly located portions of said semiconductor material layer and said support layer to thereby form separating spaces between adjacent said semiconductor devices each of which devices comprises a corresponding portion of said support layer and corresponding portion of said semiconductor material layer having corresponding portions of said first and second major surfaces;

providing a conductive interconnection layer on substantially said semiconductor material layer first major surface portions;

forming at said semiconductor material layer first major surface an electrical insulating intervening material in each said separating space extending through said semiconductor layer and said support layer and;

forming in each said semiconductor device a penetrating terminal extending through said semiconductor material layer portion therein from said first major surface portion thereof to be in electrical contact with its corresponding said support layer portion, each said penetrating terminal being formed from a location spaced apart in said semiconductor material layer first major surface from said separating spaces with said penetrating terminal on each said semiconductor device being electrically interconnected to that said semiconductor material layer first major surface portion provided in an adjacent said semiconductor device.

48. The method of claim 47 wherein a continuous said conductive interconnection layer is formed including being extended over said separation spaces prior to forming said intervening material with a removable base material filling said separating spaces which is also present between said conductive interconnection layer and said semiconductor material layer at locations where a plurality of division openings in said conductive interconnection layer are to be provided which will be located such that there is a corresponding portion of said conductive interconnection layer in each said semiconductor device, said removable base material being capable of being removed by a removing material applied to said conductive interconnection layer.

* * * * *

UNITED STATES PATENT AND TRADEMARK OFFICE
CERTIFICATE OF CORRECTION

PATENT NO.   :   4,873,201
DATED        :   October 10, 1989
INVENTOR(S)  :   Derrick P. Grimmer et al.

It is certified that error appears in the above-identified patent and that said Letters Patent is hereby corrected as shown below:

On the title page:
In the References Cited Section, under U.S. PATENT DOCUMENTS, add the following:

| | | | |
|---|---|---|---|
| 4,697,041 | 9/1987  | Okaniwa et al. | 136/244 |
| 4,624,045 | 11/1986 | Ishihara et al. | 28/572 |
| 4,585,490 | 4/1986  | Raffel et al. | 148/1.5 |
| 4,517,403 | 5/1985  | Morel et al. | 136/249 |
| 4,443,651 | 4/1984  | Swartz | 136/249 |
| 4,428,110 | 1/1984  | Kim | 29/372 |

Column 13, line 23, delete "semiconductors" and insert --semiconductive--.

Column 14, line 33, after "device" insert --a--.
Column 14, line 48, delete "tis" and insert --its--.

Signed and Sealed this

Fifth Day of February, 1991

Attest:

HARRY F. MANBECK, JR.

Attesting Officer

Commissioner of Patents and Trademarks